United States Patent [19]

Takashi et al.

[11] Patent Number: 5,553,104
[45] Date of Patent: Sep. 3, 1996

[54] INFORMATION RECORDING/REPRODUCING APPARATUS HAVING A CLOCK TIMING EXTRACTION CIRCUIT FOR EXTRACTING A CLOCK SIGNAL FROM AN INPUT DATA SIGNAL

[75] Inventors: Terumi Takashi; Akihiko Hirano, both of Odawara; Kazunori Iwabuchi, Yokohama; Hideyuki Yamakawa, Fujisawa; Yoshiteru Ishida, Chigasaki; Kazuhisa Shiraishi, Odawara; Kazutoshi Ashikawa, Maebashi, all of Japan

[73] Assignee: Hitachi, Ltd., Tokyo, Japan

[21] Appl. No.: 266,779

[22] Filed: Jun. 29, 1994

[30] Foreign Application Priority Data

Jun. 29, 1993 [JP] Japan ................................. 5-159515

[51] Int. Cl.$^6$ ......................................................... H03D 3/24
[52] U.S. Cl. ............................................. 375/373; 375/376
[58] Field of Search ......................................... 375/119, 120, 375/375; 331/1 R, 25, 18, 17, 1 A; 327/144, 145, 147, 156, 162, 163

[56] References Cited

U.S. PATENT DOCUMENTS

| 5,022,057 | 6/1991 | Nishi et al. | 375/119 |
| 5,034,967 | 7/1991 | Cox et al. | 375/119 |
| 5,036,528 | 7/1991 | Costantino et al. | 375/373 |
| 5,237,590 | 8/1993 | Kazawa et al. | 375/119 |

OTHER PUBLICATIONS

J. D. Coker et al, "Implementation of PRML in a Rigid Disk Drive", IBM Storage Systems Products Division, 1991.
IEEE Transactions on Communications, May 1976, "Timing Recovery in Digital Synchronous Data Receivers", May 1976, pp. 516–531.

Primary Examiner—Stephen Chin
Assistant Examiner—Huong Luu
Attorney, Agent, or Firm—Fay, Sharpe, Beall, Fagan, Minnich & McKee

[57] ABSTRACT

A clock timing extraction circuit for use in an information recording/reproducing apparatus has a phase comparator for comparing the reproduced signal with a selected clock signal to generate a phase error signal, a clock signal generation circuit for adjusting frequency to cause the error signal to approach zero according to the phase error signal and outputting a plurality of clock signals having mutually different phase differences, a selection circuit for outputting one of the plurality of clock signals on the basis of a selection signal, a phase difference judgement circuit for determining one of the plurality of clock signals having a minimum phase error (Vdet) and generating a selection signal for selection of the clock signal having the minimum phase difference, and a freeze circuit for blocking an output of the phase comparator until the clock signal having the minimum phase error is selected. The information recording/reproducing apparatus has an AGC circuit for limiting an amplitude of a reproduced signal received from a recording medium, the aforementioned clock timing extraction circuit, and a decoder circuit. The clock timing extraction circuit extracts a clock signal from an output signal of the AGC circuit and the decoder decodes the output signal of the AGC circuit on the basis of the extracted clock signal.

12 Claims, 10 Drawing Sheets

F I G. 13
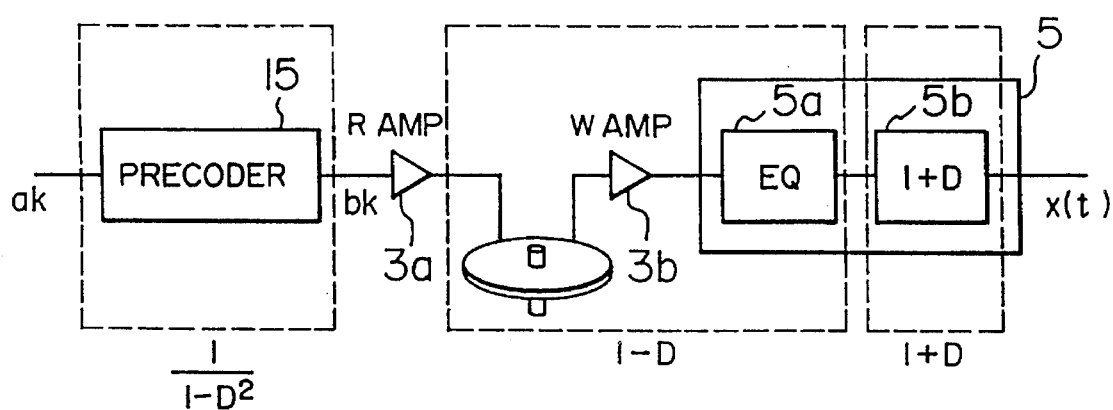

(1) VCO OUTPUT $CK_1$ (2) VCO OUTPUT $CK_2$

INFORMATION RECORDING/REPRODUCING APPARATUS HAVING A CLOCK TIMING EXTRACTION CIRCUIT FOR EXTRACTING A CLOCK SIGNAL FROM AN INPUT DATA SIGNAL

BACKGROUND OF THE INVENTION

The present invention relates to a clock timing extraction circuit which uses a phase control feedback loop to generate a clock synchronized with input data and also relates to an information recording/reproducing apparatus which uses the clock timing extraction circuit.

In a magnetic recording/reproducing apparatus for recording and reproducing an information signal in and from such a magnetic recording medium as a magnetic disk, for the purpose of identifying a data signal reproduced from the magnetic recording medium, it is necessary to generate a clock synchronized with the reproduced signal. A clock timing extraction circuit is used for this purpose and is arranged to generate a clock synchronized with the reproduced signal to cause the frequency and phase of the clock to follow variations in the frequency and phase of the reproduced information signal resulting from fluctuations in the rotation of the magnetic disk as the magnetic recording medium. Explanation will now be directed to a reproduction-associated signal processing circuit and a clock timing extraction circuit in the magnetic recording/reproducing apparatus as well as to a phase comparator in a phase locked loop (PLL) circuit constituting the clock timing extraction circuit, with reference to FIGS. 9, 10, 11 and 12.

Referring first to FIG. 9, there is shown a block diagram of an example of a reproduction-associated signal processing circuit for use in a general magnetic recording/reproducing apparatus to which the present invention can be applied. The illustrated signal processing circuit includes a magnetic recording medium 1, a magnetic head 2, a read/write amplifier 3, an automatic gain control (AGC) circuit 4, a filter circuit 5, an analog-to-digital (A-to-D) converter 6, a timing extraction circuit 7, a Viterbi decoder 8, a controller 9, and a microcomputer 10.

In the drawing, an information signal recorded on the magnetic recording medium 1 is reproduced by the magnetic head 2 into an electric signal 101 that is then amplified by the read/write amplifier 3 to obtain an amplified analog signal 102. The amplified analog signal 102 is subjected at the AGC circuit 4 to a controlling operation with respect to its amplitude value to generate an output signal 103. The signal 103 is then subjected at the filter circuit 5 to a waveform processing operation to improve the performance of the Viterbi decoder 8. The filter circuit 5 outputs a reproduction signal 104 subjected to the waveform processing operation and sends it to the A-to-D converter 6 to be quantized. The A-to-D converter 6 outputs a reproduction data signal 105 subjected to the quantizing operation. The data signal 105 is sent to the AGC circuit 4 and the Viterbi decoder 8 and also sent to the timing extraction circuit 7 which generates a timing clock 106 necessary for data identification. The Viterbi decoder 8 decodes the reproduction data signal 105 received from the A-to-D converter 6 on the basis of the timing clock 106 received from the timing extraction circuit 7. The Viterbi decoder 8 outputs a decoded reproduction data signal 107 and a timing clock 108 and supplies them to the controller 9. The controller 9, under control of the microcomputer 10, subjects the input reproduction data signal 107 to a format converting operation and transmits it to a host device (not shown).

In this connection, the timing clock 106 issued from the timing extraction circuit 7 is also used as a sampling clock of the A-to-D converter 6 and as a timing clock of the AGC circuit 4. The filter circuit 5 is made up of an equalizer 5a for performing Nyquist equalizing operation over the input signal 103 and (1+D) block 5b for performing partial response class 4 (PR4) operation, as shown in FIG. 10. While the filter circuit is placed at the former stage of the A-to-D converter in FIG. 9, it can be replaced at the latter stage of the A-to-D converter. In this case, the filter circuit is included in the feedback loop for the clock timing extraction.

With such a reproduction-associated signal processing circuit as shown in FIG. 9, when it is desired to use a Viterbi decoder as a decoder 8 into which a digital value is input, it is desirable from the viewpoint of its performance that the AGC circuit 4 and timing extraction circuit 7 use the digital value of the input data 105.

FIG. 11 is a block diagram of the timing extraction circuit 7 of a conventional digital control (analog drive) type, which includes a phase comparator 11, a digital-to-analog (D-to-A) converter 12, a loop filter 13, a voltage controlled oscillator (VCO) 14. Elements in FIG. 11 which correspond to those in FIG. 9 are denoted by the same reference numerals.

In the drawing, the VCO 14 generates the aforementioned timing clock 106. The reproduction data signal 105 received from the A-to-D converter 6 is subjected, at the phase comparator 11, to a detection of a phase difference from the timing clock 106. A digital value 110 indicative of the phase difference received from the phase comparator 11 is converted, at the D-to-A converter 12, to an analog value 111 that is then subjected at the loop filter 13 to an integrating operation to obtain a control voltage 112. Since the oscillation frequency of the VCO 14 is controlled according to the control voltage 112, the VCO 14 outputs a timing clock 106 that is synchronized in frequency and phase with the input data 105.

Turning now to FIG. 12, there is shown a block diagram of an example of the phase comparator 11 in FIG. 11 which includes a discriminator (or a quantizer) 21, delays 22, 23, multipliers 24, 25, and a subtracter 26.

This phase comparator is designed to calculate a phase error on the basis of an amplitude value at a sample point as described in a paper written by Kurt H. Mueller, et al. and entitled "Timing Recovery in Digital Synchronous Data Receivers" in IEEE Transactions on Communications, May, 1976.

In FIG. 12, the reproduction data 105 received from the A-to-D converter 6 (see FIG. 11) is subjected at the discriminator 21 to its level ("1" or "0") judging operation, and the discriminator 21 generates a decision signal 201 indicative of its result. The reproduction data signal 105 and the decision signal 201 are subjected at their respective delays 22 and 23 to a delay corresponding to one sample. The multiplier 24 multiplies a reproduction data signal 202 received one-sample earlier from the delay 22 by the decision signal 201 from the discriminator 21; while the multiplier 25 multiplies a decision signal 23 received one-sample earlier from the delay 23 by the reproduction data signal 105. An output data signal 204 of the multiplier 24 is subtracted by the subtracter 26 from an output data signal 205 of the multiplier 25 to thereby obtain the aforementioned phase difference 110.

Explanation will next be made as to the waveforms of signals at various points during the magnetic recording/ reproducing operation and as to the operation of the phase comparator 11 based thereon.

FIG. 13 shows how a series of codes ($a_k$) taking a binary value of "0" or "1" to be recorded is converted into a signal x(t) to be inputted to the A-to-D converter 6 through a path including a precoder 15, a read amplifier 3a, the magnetic disk 1, a write amplifier 3b, and an equalizer 5a and a (1+D) block 5b of the filter 5. In this case, since the AGC circuit 4 has no effect on the transmission characteristics, it is omitted.

In FIG. 13, the record-associated precoder 15 precoded the code signal $a_k$ and outputs a precode output signal $b_k$. In the illustrated example, a characteristic $1/(1-D^2)$ is provided for the code signal $a_k$. In this connection, reference symbol D refers to a delay operator which delays an input signal by a bit period T. Since an isolated pulse exhibits a differentiating characteristic in a reproduction mode, the equalizer 5a offers Nyquist equalization to provide the (1−D) characteristic. Furthermore, the latter stage performs the (1+D) operation to offer the overall $(1-D^2)$ transmission characteristic.

The output signal x(t) is expressed by the following equation (1).

$$x(t) = \Sigma(b_k - b_{k-2})h(t - kT) \qquad (1)$$
$$= \Sigma(b_k - b_{k-2})h_{-k}(t)$$

where $h(t)=\sin(\pi t/T)/(\pi t/T)$

Assume that $c_k$ is written as follows.

$$c_k = (b_k - b_{k-2}) \qquad (2)$$

Then, the following relation is satisfied.

$$c_k \in \{-1, 0, 1\}$$

Further, when t=0, i.e., when a phase error between the reproduced data signal and the clock is zero, $h_{-k}(t)$ is:

$$h_{-k}(0) = 1 \quad \ldots k=0 \qquad (3)$$
$$= 0 \quad \ldots k \neq 0$$

Thus, the decision conditions of the discriminator 21 in the phase comparator should be defined as follows in order to produce an estimate $\{\bar{c}_k\}$ for the $c_k$ from a value $x_k(\tau)$ at a time point t ($=\tau+kT$) where a phase error $\tau$ is present.

$$\{\bar{c}_k\} = -1 \quad \ldots x_k(\tau) \leq -0.5 \qquad (4)$$
$$= 0 \quad \ldots 0.5 < x_k(\tau) < 0.5$$
$$= 1 \quad \ldots x_k(\tau) \geq 0.5$$

The phase comparator 11, on the basis of the $\{\bar{c}_k\}$ and $x_k(\tau)$, generates an output signal $y_k(\tau)$ which follows at a point in time ($\tau+kT$).

$$y_k(\tau) = \{\bar{c}_k\}x_{k-1} - \{\bar{c}_k\}_{-1}x_k \qquad (5)$$
$$= \bar{c}_k\{\ldots + c_k h_{-1}(\tau) + c_{k-1}h_0(\tau) + c_{k-2}h_1(\tau) + \ldots\} - \bar{c}_{k-1} \cdot \{\ldots + c_{k+1}h_{-1}(\tau) + c_k h_0(\tau) + c_{k+1}h_1(\tau) + \ldots\}$$

When the estimate $\bar{c}_k$ is equal to $c_k$, the following relationship is satisfied.

$$y_k(\tau) = \ldots + \{c_k^2 - c_{k-1}c_{k+1}\}h_{-1}(\tau) + \qquad (7)$$
$$0 h_0(\tau) + \{c_k c_{k-2} - c_{k-1}^2\}h_1(\tau) + \ldots$$

Since $h_n(\tau) \approx 0$ when a relationship of $|n| \leq 2$ is satisfied, the following equation is satisfied.

$$y_k(\tau) = A_{-1}h_{-1}(\tau) + A_1 h_1(\tau) \qquad (8)$$

where $A_{-1} = c_k^2 - c_{k-1}c_{k+1}$ $$A_1 = c_k c_{k-2} - c_{k-1}^2$$

Assuming now that the values of the $A_{-1}$ and $A_1$ are fully random, though they actually vary with the array of the code sequence $\{a_k\}$, then averages $E(A_{-1})$ and $E(A_1)$ for the values $A_{-1}$ and $A_1$ meet the following relationship.

$$E(A_{-1}) = -E(A_1) = A(\neq 0) \qquad (9)$$

Hence, the following equation is satisfied.

$$y_k(\tau) = A\{h_{-1}(\tau) - h_1(\tau)\} \text{tm} \quad (10)$$

For an input data signal having a phase error $\tau$, the phase comparator 11 generates an output signal $y_k(\tau)$ as mentioned above. Since the phase comparator 11 has a phase comparison characteristic that is substantially linear to the phase error $\tau$, the timing extraction circuit 7 performs its phase feedback control operation on the basis of the digital value inputted to the decoder 8 to generate a timing clock synchronous with the input data signal.

The timing extraction circuit 7 performs its feedback control operation based on the PLL circuit including the A-to-D converter, and included in its closed loop are the A-to-D converter 6, phase comparator 11 and D-to-A converter 12 connected in series, as already mentioned above. Shown in FIG. 14 is a timing chart for explaining a sequence of the operation of the A-to-D converter 6, phase comparator 11 and D-to-A converter 12. Problems in the prior art technique will be explained with use of FIG. 14.

The A-to-D converter 6 takes the analog input signal 104 at the timing of an rising edge in the timing clock 106 received from the timing extraction circuit 7, compares the value of the input signal with a reference voltage set therein, and encodes its comparison result into the binary data (digital value) signal 105. Reference symbol $t_1$ in FIG. 14 denotes a time between the take-in at the rising edge and the establishment of the output signal 105.

The phase comparator 11 accepts the output data signal 105 of the A-to-D converter 6, processes it therein, and outputs the digital value signal 110 having phase error information. This digital-value calculation time for the phase comparator 11 is assumed to be $t_2$. The D-to-A converter 12 latches the output data signal 110 of the phase comparator 11 at the timing of a rising or falling edge in the timing clock 106, converts it into the analog value signal 111, and outputs it. This edge of the timing clock 106 at which timing the output data signal 110 of the phase comparator 11 is accepted, corresponds to one edge of the timing clock after a time $t_0$ elapses from the rising edge of acceptance of the analog signal at the timing extraction circuit 7. The time $t_0$ corresponds to a sum of the aforementioned time $t_1$, a time $t_2$ and a setup time $t_3$ necessary for the latch. Accordingly, a time duration after the A-to-D converter 6 accepts the data signal 104 until the D-to-A converter 12 outputs the analog value signal 111 having the phase error information must include at least a delay time of 0.5 T (corresponding to a phase difference of 180 degrees), where T denotes one period of the clock.

When the frequency of the timing clock 106 becomes high and its period T becomes relatively small with respect to the $t_0$ uniquely determined by its circuit scale, process, etc., the aforementioned delay time 0.5 T is required to be greater. This also applies to the calculation time including arithmetic pipeline to calculate the phase error at the phase comparator. These time lags undesirably affect the feedback control as a waste time. When a secondary PLL circuit is employed for this feedback control for example, a waste time element nT and a phase margin $\phi_m$ in the loop have a relationship which follows.

$$\phi_m = \tan^{-1}\frac{-\sin\{(2\pi nk)(\omega_n/\omega_s)\} + 2k\xi\cos\{(2\pi nk)(\omega_n/\omega_s)\}}{\cos\{(2\pi nk)(\omega_n/\omega_s)\} + 2k\xi\sin\{(2\pi nk)(\omega_n/\omega_s)\}} \quad (11)$$

$$k = \sqrt{\{(4\xi^2 + \sqrt{\{(2\xi)^4 + 4)\}/2\}}} \quad (12)$$

where, $\xi$ denotes a damping factor, $\omega_n$ denotes a natural angular frequency, $\omega_s$ denotes a sample angular frequency and satisfies a relationship $\omega_s = \{2\pi/T\}$.

In the absence of the waste time (n=0), the phase margin $\phi_m$ is expressed as a function of $\xi$ alone; whereas, in the presence of the waste time, the phase margin $\phi_m$ is expressed as a function of $\xi$, n and $\omega_n/\omega_s$ and thus the phase margin is decreased with the increase of n and $\omega_n/\omega_s$. Since a certain level of phase margin $\phi_m$ must be secured in order to obtain a stable response, determination of the waste time based on the circuit arrangement, etc. automatically determines an upper limit value of $\omega_n/\omega_s$.

FIG. 15 shows a phase acquisition characteristic of the PLL circuit, in which the abscissa denotes normalization of multiplication of time t by the natural angular frequency $\omega_n$ and the ordinate denotes normalization of division of the phase error $\phi(t)$ by the initial phase error $\phi_0$. The shape of this response is uniquely determined for each value Of the damping factor $\xi$.

When it is prescribed that phase acquisition is completed when the absolute value $|\phi(t)|$ of a phase error becomes below a certain phase error $\phi_1$ and at a time when the completion of the phase acquisition in the PLL circuit corresponds to an acquisition time $T_{aq}$; the acquisition time $T_{aq}$ can be expressed as a function of the natural angular frequency $\omega_n$ and the initial phase error $\phi_0$. That is, the smaller the natural frequency $\omega_n$ and the greater the initial phase error $\phi_0$, the larger the acquisition is. Upon reading of data from a magnetic disk unit or the like, a time $T_{sync}$, within which the phase acquisition of a timing extraction circuit using the PLL circuit must be completed, is determined by the format (PLO sync duration) of the disk and by a data transmission rate thereof. Therefore, the natural frequency $\omega_n$ is set so that the acquisition time $T_{aq}$ is smaller than the time $T_{sync}$.

When consideration is paid to the stability of the response as mentioned above, however, the natural frequency $\omega_n$ is determined by its upper limit value and thus the acquisition time $T_{aq}$ is also limited in its minimum value. This results in a problem that the transmission rate cannot be set to be higher than a certain constant value. On the contrary, when the natural angular frequency $\omega_n$ is set so that the acquisition is completed within the time $T_{sync}$ corresponding to the transmission rate, the phase margin $\phi_m$ is decreased and therefore the response becomes undesirably unstable.

SUMMARY OF THE INVENTION

It is an object of the present invention to provide a clock timing extraction circuit which, when a delay in a feedback loop is large or even when a transmission rate is high, can secure stable operation of the feedback loop while avoiding increase of an acquisition time. Another objects is to provide an information recording/reproducing apparatus which uses the clock timing extraction circuit to establish a stable reading operation. In a clock timing extraction circuit in accordance with the present invention, the value of an initial phase error $\phi(0)$ at a point in time t=0, in a phase acquisition characteristic of FIG. 15, is set at a small level, so that, even when it is impossible to reduce a delay time in a feedback loop, an acquisition completion time $T_a$ can be reduced. To this end, there are prepared a plurality of clock signals having mutually known predetermined phase differences. At the time of initial phase adjustment, one of the plurality of clock signals having a minimum phase error with respect to a reproduced signal is selected to start its phase acquisition operation.

In accordance with an aspect of the present invention, there is provided a clock timing extraction circuit which includes a phase comparator for comparing the reproduced signal with a selected clock signal to generate a phase error signal, a clock signal generation circuit for adjusting frequency to cause the phase error signal to approach zero and outputting a plurality of clock signals having mutually different phase differences, a selection circuit or outputting one of the plurality of clock signals on the basis of a selection signal, a phase difference judgement circuit for determining one of the plurality of clock signals having a minimum phase error (Vdet) and generating a selection signal for selection of the clock signal having the minimum phase difference, and a freeze circuit for blocking an output of the phase comparator until the clock signal having the minimum phase error is selected.

An information recording/reproducing apparatus in accordance with the present invention includes an AGC circuit for limiting an amplitude of a reproduced signal received from a recording medium, the aforementioned clock timing extraction circuit, and a decoder circuit, and wherein the clock timing extraction circuit extracts a clock signal from an output signal of the AGC circuit and the decoder decodes the output signal of the AGC circuit on the basis of the extracted clock signal.

When one of the plurality of generated clock signals having a minimum phase difference with respect to the reproduced signal is selected, the maximum of the initial phase error at the time of starting a phase acquisition operation toward the reproduced signal can be made small compared to that of a prior art. During the selection of such a clock signal, the state of the feedback loop is fixed, thereby enabling ensured selection of such a clock signal. When such clock signal selection is completed, the information recording/reproducing apparatus starts its phase acquisition operation toward the reproduced signal. Thus, the acquisition operation can be carried out with the stabilized operation of the feedback loop, while avoiding an acquisition time from being increased.

BRIEF DESCRIPTION OF THE DRAWINGS

FIG. 13 is a diagram for explaining how information data is magnetically recorded and reproduced;

DESCRIPTION OF THE PREFERRED EMBODIMENTS

Embodiments of the present invention will be described with reference to the accompanying drawings.

Figure 1:
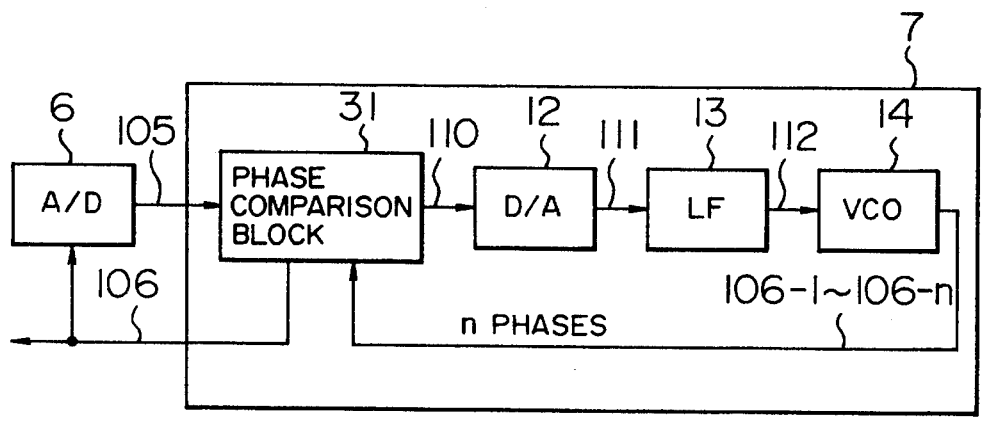
FIG. 1 is a block diagram of a clock timing extraction circuit in accordance with an embodiment of the present invention.
Figure 11:
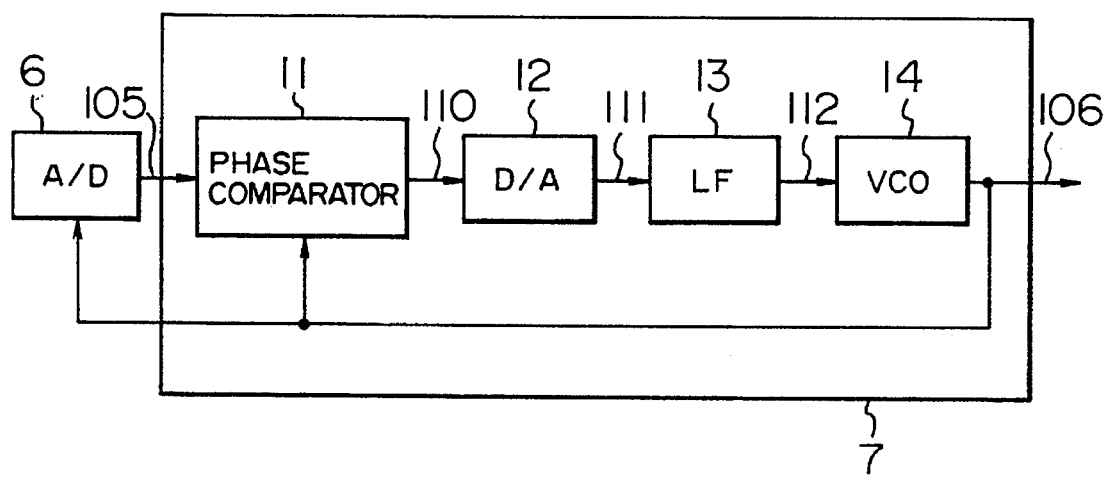
FIG. 11 is a block diagram of an example of a timing extraction circuit in the prior art.

Referring first to FIG. 1, there is shown a block diagram of a clock timing extraction circuit in accordance with an embodiment of the present invention, in which reference numeral 31 denotes a phase comparison block and parts corresponding to those in FIG. 11 are denoted by the same reference numerals and explanation thereof is omitted.

In FIG. 1, an output signal 105 from an A-to-D converter 6 and an n-phase clock signal of clocks $106_{-1}$ to $106_{-n}$ are supplied to the phase comparison block 31, so that the block 31 generates a phase error signal 110. The phase error signal 110 is subjected at a D-to-A converter 12 to a conversion to an analog signal as its analog output signal 111. The analog output signal 111 of the D-to-A converter 12 is subjected at a loop filter 13 to an integrating operation. The VCO 14, which is controlled by an output signal 112 of the loop filter 13, generates the aforementioned n-phase clock signal.

Figure 2:
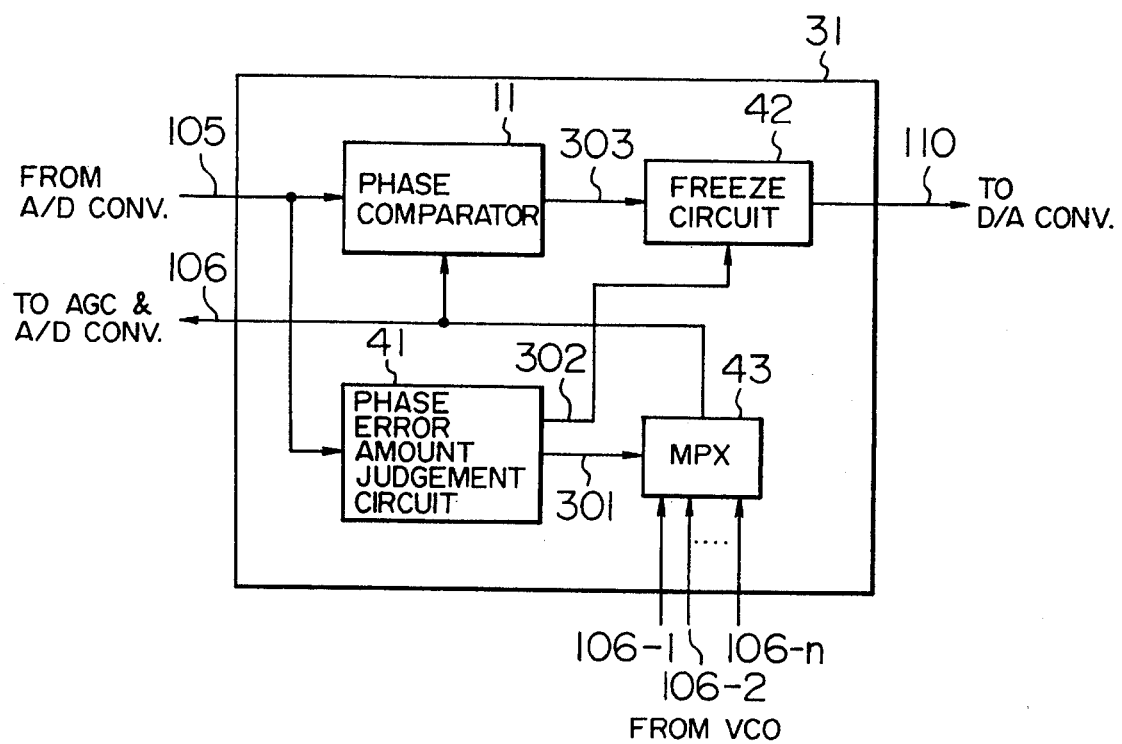
FIG. 2 is a block diagram of a specific example of a phase comparison block in FIG. 1.
Figure 12:
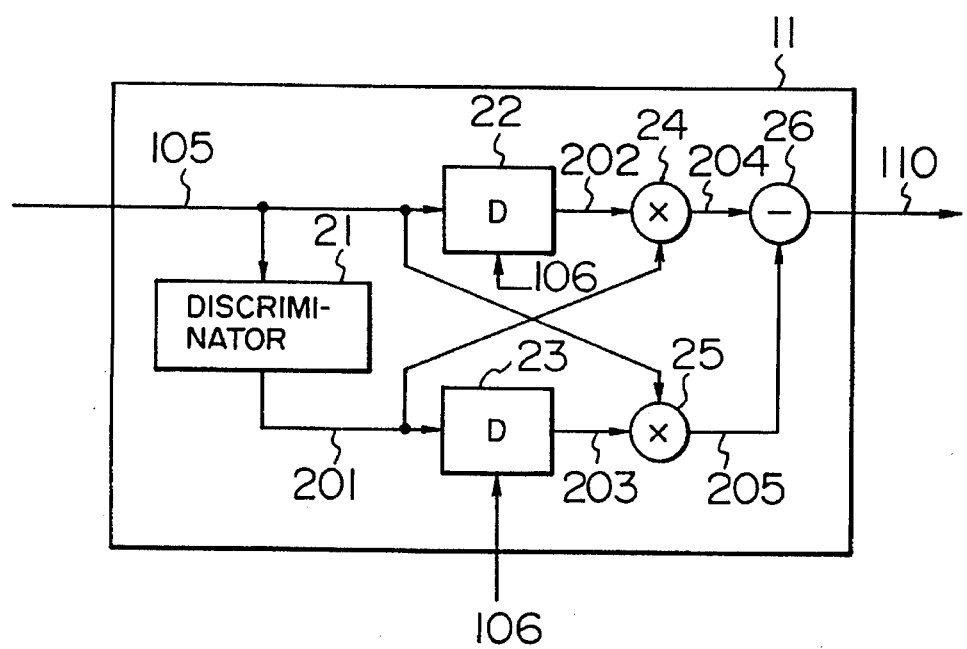
FIG. 12 is a block diagram of a phase comparator in FIG. 11.
Figure 14:
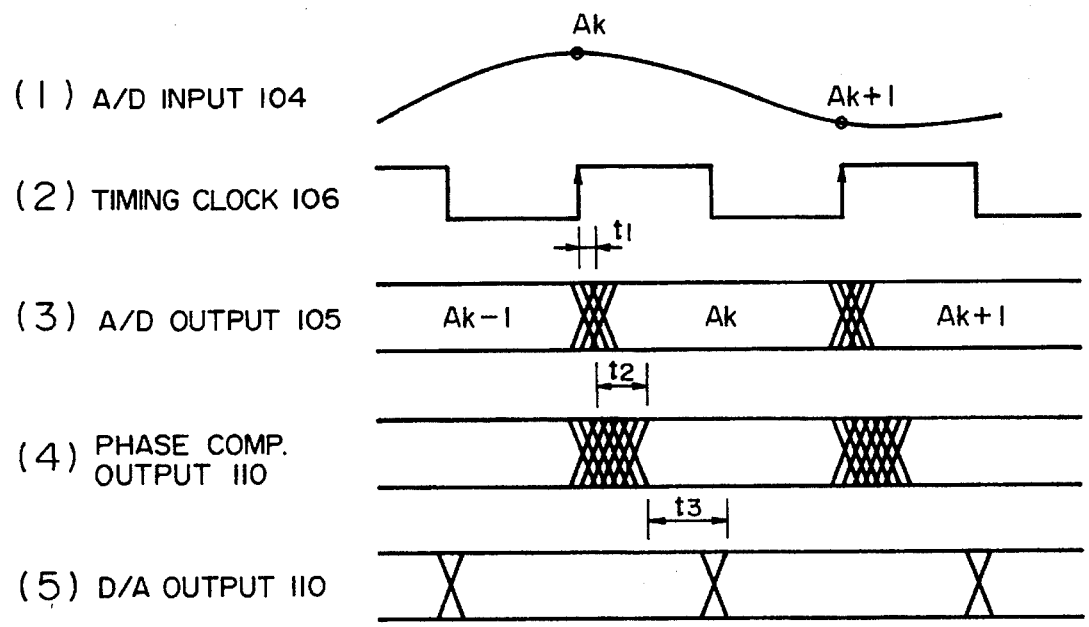
FIG. 14 is a timing chart for explaining a sequence of operation of an A-to-D converter, a phase comparator and a D-to-A converter in FIG. 11.
Figure 15:
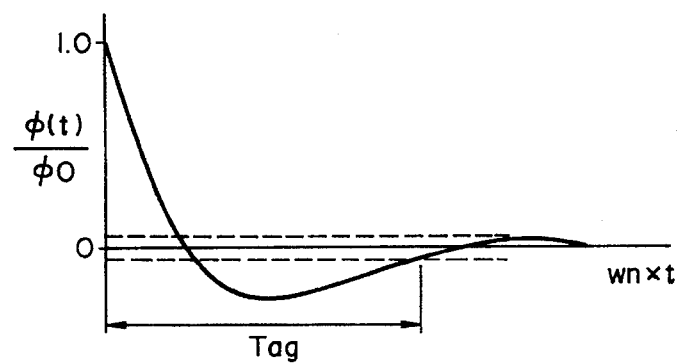
FIG. 15 is a diagram for explaining a phase acquisition characteristic of a PLL circuit.

FIG. 2 is a block diagram of a specific example of the phase comparison block 31 in FIG. 1, which includes a phase comparator 11 similar to the conventional phase comparator 11 in FIG. 12, a phase error amount judgement circuit 41, a freeze circuit 42, and a multiplexer 43.

In FIG. 2, the phase error amount judgement circuit 41 judges an initial phase error in the output data signal 105 of the A-to-D converter 6 (see FIG. 1) by such a method as to be explained later, and outputs control signals 301 and 302 corresponding to its judgement result. The multiplexer 43 selects one of the clocks $106_{-1}$ to $106_{-n}$ in the n-phase clock signal according to the control signal 301 and outputs it as a timing clock signal 106. This timing clock signal 106 is supplied to the phase comparator 11, to an external device, and also to the A-to-D converter 6 as shown in FIG. 1. An output signal 303 of the phase comparator 11 is sent to the freeze circuit 42 and frozen by the control signal 302 received from the phase error amount judgement circuit 41.

Figure 16:
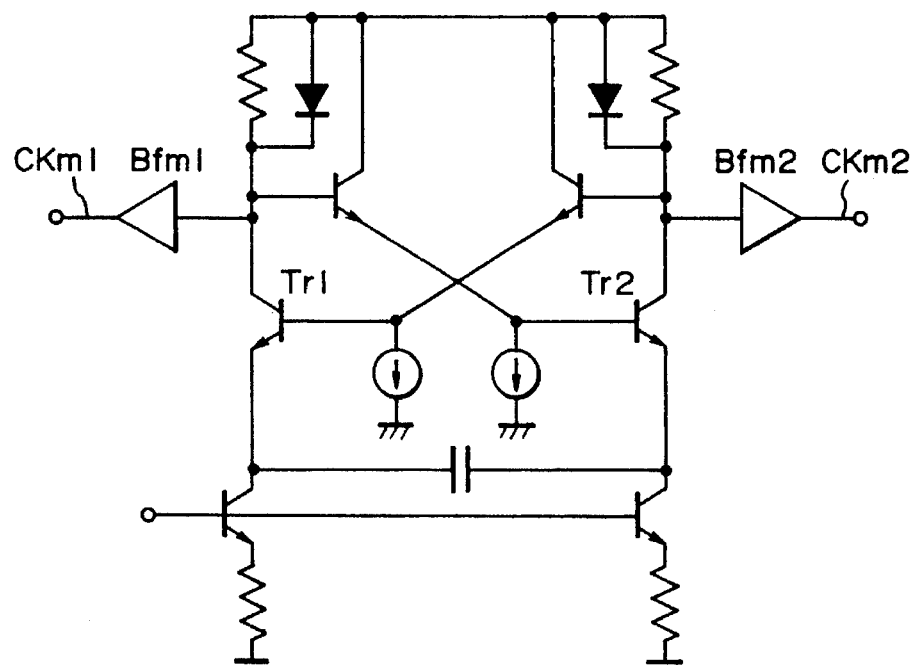
FIG. 16 is a circuit diagram of an emitter coupled multivibrator as a VCO.
Figure 17:
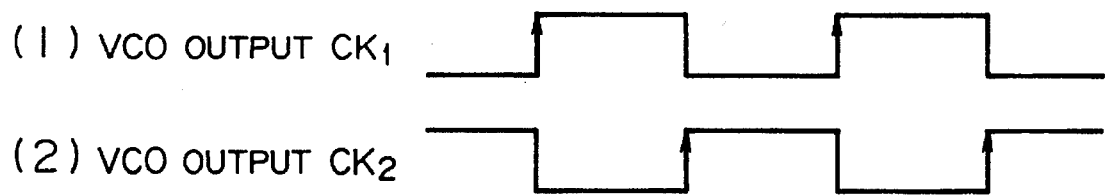
FIG. 17 shows waveforms of clocks generated by the emitter coupled multivibrator of FIG. 16.

The n-phase clock signal output by the VCO 14 can take 2 phases or an odd number (3 or higher) of phases. FIG. 16 shows an example of the VCO 14 comprising an emitter coupled multivibrator, in which collector terminal voltages of transistors Tr1 and Tr2 are applied to buffers Bfm1 and Bfm2 to generate a clock signal of clocks ck1 and ck2 having high (H) and low (L) levels mutually inverted in level, as shown in FIG. 17.

Figure 18:
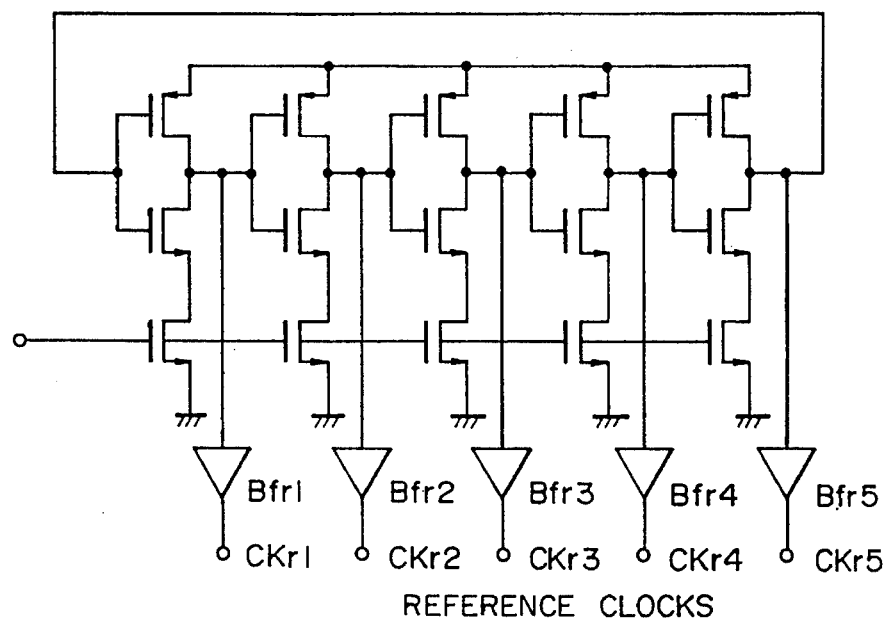
FIG. 18 is a circuit diagram of a ring oscillator as a VCO.

FIG. 18 also shows another specific example of the VCO 14 which includes a ring oscillator.

Figure 19:
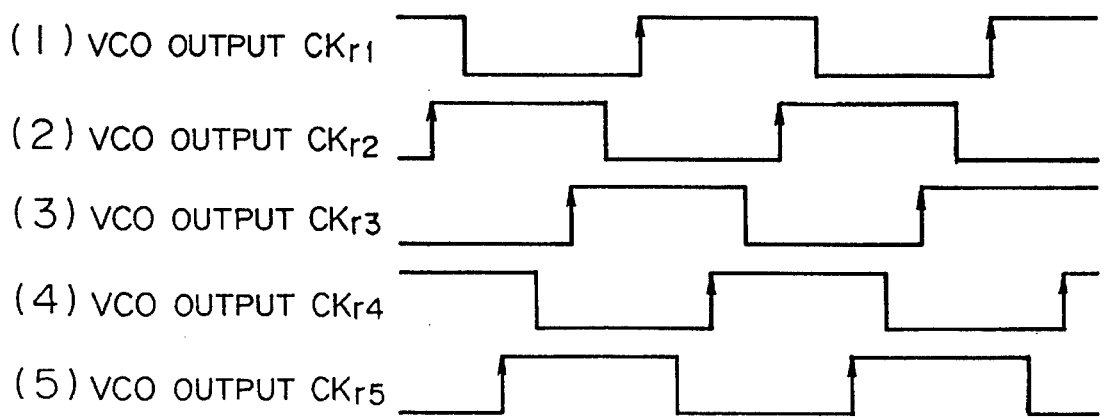
FIG. 19 shows waveforms of clocks generated by the ring oscillator of FIG. 18.

In the drawing, output signals of an odd number of inverters are supplied to inverters of a next stage to form a loop. For example, when the VCO is arranged to have a 5-stage structure as illustrated, buffers Bfr1 to Bfr5 having an identical load capacity are provided to output terminals of the inverters to generate such a 5-phase clock signal of clocks mutually shifted by a phase of $2\phi/5$ radians, as shown in FIG. 19.

Explanation will next be made as to the operation of this embodiment. In this embodiment, when the clock signal 106 is synchronized with the input data signal 105, a regular pattern (preformat) provided in a preamble ahead of the input data signal 105 where information data is actually present is used to perform a phase acquisition operation. This regular pattern x(t) is generated with use of a series of codes $\{a_k\}$ in such a manner that $\{c_k\}$ of the aforementioned equation (2) is $\{\ldots, 1, 1, -1, \ldots\}$. In this case, it will be clear from the aforementioned equation (1) that the input data signal 104 of the A-to-D converter 6 expressed by x(t) can be nearly approximated by a sine wave having a period of 4T. The phase error amount judgement circuit 41, when receiving a read start command, supplies the control signal 301 to the MPX 43 so as to select one of the clocks, $106_{-1}$, in the output clock signal of the VCO 14 as a reference. The phase error amount judgement circuit 41 discriminates the output data 105 as a sampling value for the input data 105 of the A-to-D converter 6, e.g., under the following conditions.

$$V_{det} = 0 \ldots \sqrt{2} \cdot \sin(\pi/8) < |V_{105}| \leq \sqrt{2} \cdot \sin(3\pi/8) \qquad (13)$$
$$= 1 \ldots \text{else}$$

where $V_{det}$ represents a judgement result of the phase error amount judgement circuit 41, $V_{105}$ represents the output data 105 of the A-to-D convener 6, and $\pi=T/2=180$ degrees.

The relationship (13) refers to the conditions that, when such a VCO 14 issuing output clock signals having 2 mutually opposite phases as shown in FIG. 16 is used as a VCO and when the input data signal 104 is assumed to be a sine wave, the output data signal=0 for a phase error of $-\pi/2$ to $\pi/2$ between the input data signal and clock signal and the output data signal=1 otherwise. The discrimination conditions of the relationship (13) are not limited to the above but the threshold levels may be externally set according to such an actual environment as a recording medium. The phase error amount judgement circuit 41 generally detects that the phase error between the input data signal and clock signal belonging to one of the divided phase error levels corresponding to the number of phases of the clock signal generated by the VCO 14.

When the judgement result $V_{det}$ of the phase error amount judgement circuit 41 is 0, that is, when the phase error between the input data signal and the clock $106_{-1}$ is between $-\pi/2$ and $\pi/2$, the MPX 43 still continues to output the clock $106_{-1}$ which has been issued so far, without stopping it.

While the phase error amount judgement circuit 41 is detecting a phase error the freeze circuit 4, freezes the output data signal 303 of the phase comparator 11. During the freezing operation, the VCO 14 is not controlled and its frequency remains constant. After the circuit 41 detects the initial phase, the clock selected by the MPX 43 is supplied to the A-to-D converter 6 and to the phase comparator 11 so that the freezing operation continues until a phase comparison result for the clock is outputted. When the judgement result $V_{det}$ of the phase error amount judgement circuit 41 is 1, that is, when the phase error between the input data signal 105 and the clock signal is out of the range of $-\pi/2$ to $\pi/2$, the MPX 43 selects the clock $106_{-2}$ that is in anti-phase with the clock $106_{-1}$ that has been issued so far and supplies it to the A-to-D converter 6 and the phase comparator 11. Since the clocks $106_{-1}$ and $106_{-2}$ have a phase shift of $\pi/2$, when the phase error between the clock 106 and the input data signal 105 of the phase comparator 11 detected by the phase error amount judgement circuit 41 is out of the range of $-\pi/2$ to $\pi/2$, the phase error can be set to be within the range of $-\pi/2$ to $\pi/2$ through change-over between the clocks. The freeze circuit 42 continues its freezing operation until, as in the above, the phase error amount judgement circuit 41 detects the initial phase and outputs its phase comparison result on the basis of the clock selected by the MPX 43.

The phase error amount judgement circuit 41 may be made up of a comparator and a register for outputting a judgement reference phase value, or may be arranged to be able to determine by another method whether or not a phase difference between the reproduced signal and clock is within a judgement reference value range.

The phase error amount judgement circuit 41 may also determine its output signal on the basis of even the input data signal 105 of one sample quantized by the A-to-D converter 6. However, when the input data signal 105 contains noise, there is a possibility that the input data corresponding to only one sample results in an erroneous detection result. To avoid this, a majority decision circuit may be provided within the phase error amount judgement circuit 41 to select the highest one of the phase detection results carried out by a plurality of times and to output the selected one. In this case, the higher the detection frequency is the smaller the erroneous detection possibility is, but the acquisition time is also correspondingly increased. Thus, the detection frequency is determined by a trade-off between the acquisition time and the erroneous detection rate.

Figure 3:
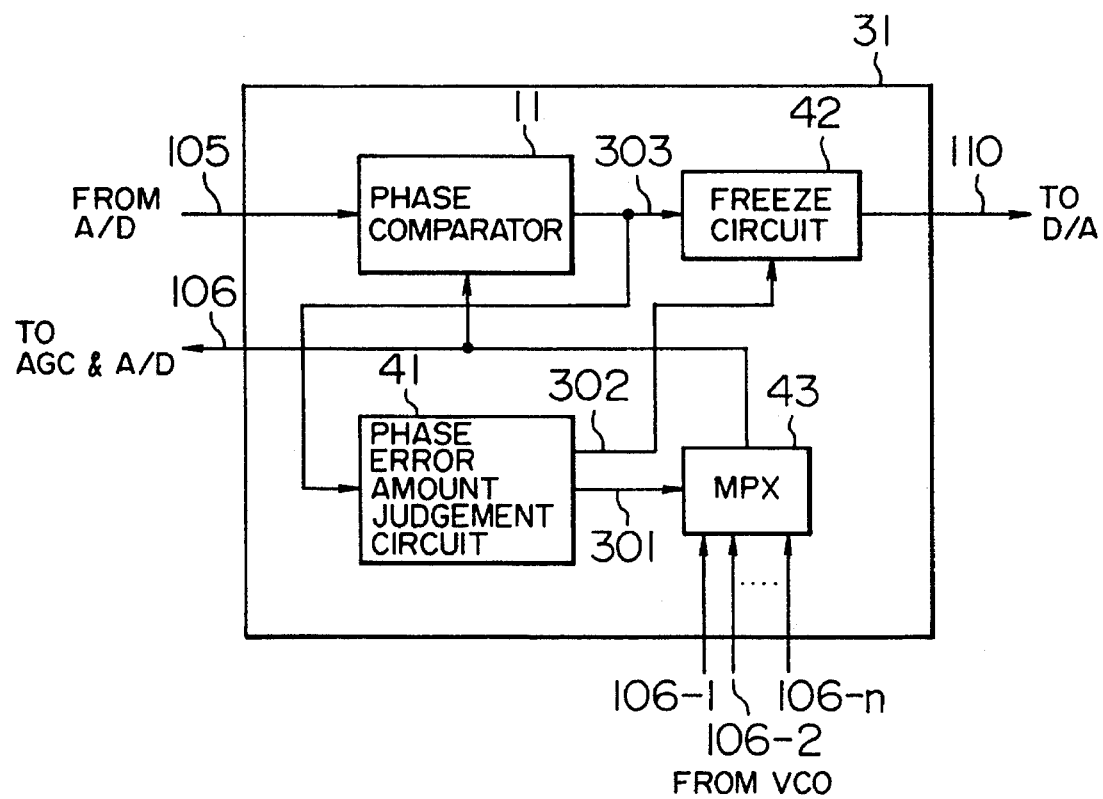
FIG. 3 is a block diagram of another specific example of the phase comparison block in FIG. 1.

In the case of the phase comparison block 31 in FIG. 1, the phase error amount judgement circuit 41 has detected a phase error amount and generated the select signal 301 for the MPX 43 according to the detected error amount. FIG. 3 shows another specific example of the phase comparison block 31.

Figure 4:
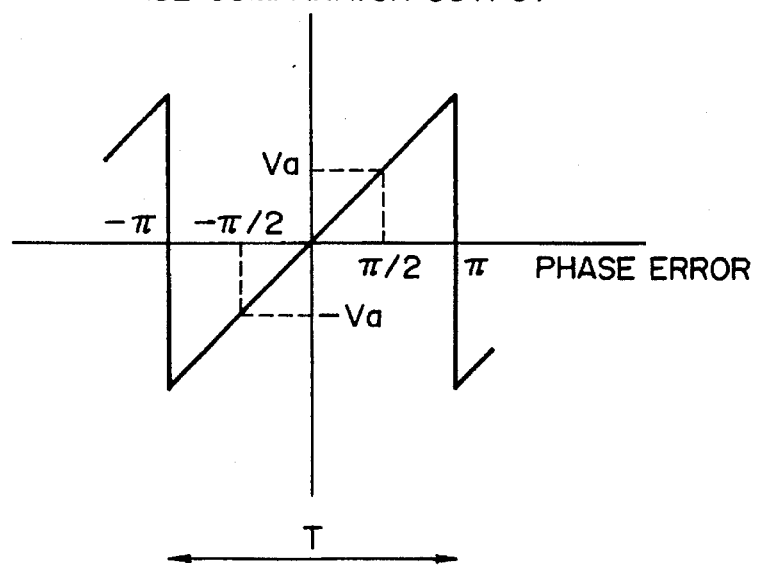
FIG. 4 is an input/output characteristic diagram of a phase comparator in FIGS. 2 and 3.

As shown in FIG. 3, the specific example is substantially the same as the example of FIG. 2, except that it is arranged so that an input data signal of a phase error amount judgement circuit 41a is used as an output data signal 303 of a phase comparator 11. Assuming now that the phase comparator 11 has such a phase comparison characteristic as shown in FIG. 4, then the judgement conditions of the phase error amount judgement circuit 41a are set as follows.

$$V_{det} = 0 \ldots |V_{303}| \leq V_a \quad (14)$$
$$= 1 \ldots else$$

where $V_a$ represents the output of the phase comparator for the phase error of $\pi/2$, and $V_{303}$ represents the output data 303 of the phase comparator 11.

This is equivalent to when the phase error detection, which has been carried out by the phase error amount judgement circuit 41 in FIG. 2, is replaced by the phase comparator output signal 303. Accordingly, other operation is substantially the same as that of the example of FIG. 2.

Figure 5:
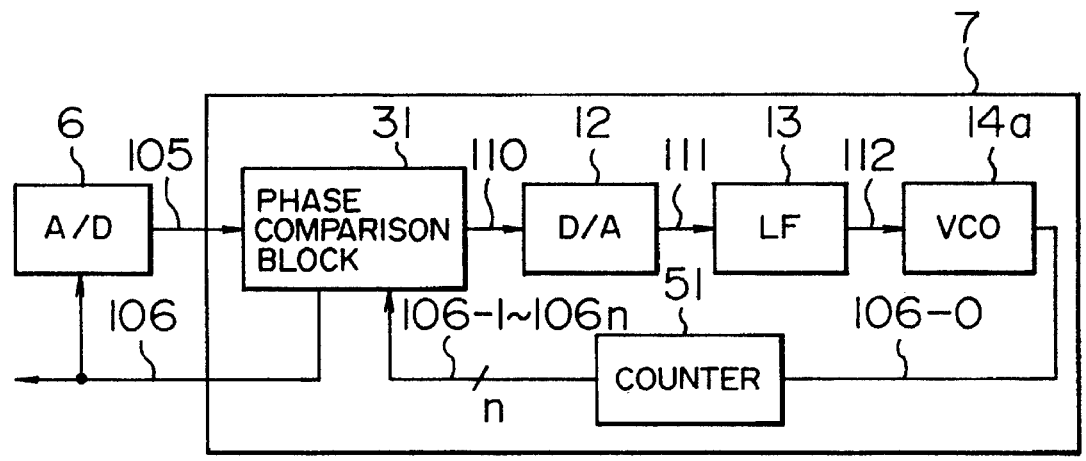
FIG. 5 is a block diagram of a timing extraction circuit in accordance with another embodiment of the present invention.

Shown in FIG. 5 is a block diagram of a clock timing extraction circuit in accordance with another embodiment of the present invention, in which reference symbol 14a denotes a VCO, 51 denotes a counter, and parts corresponding to those in FIG. 1 are denoted by the same reference numerals and symbols.

In FIG. 5 drawing, the VCO 14a outputs a single-phase clock signal $106_{-0}$ to the counter 51 which in turn frequency-divides the clock into 'n' n-phase clocks $106_{-1}$ to $106_{-n}$ (the frequency of the clock $106_{-0}$ corresponding to n times that of the original clock $106_{-0}$ and supplies those clocks to a phase comparison block 31. Other respects are substantially the same as in the embodiment of FIG. 1. The phase comparison block 31 may include a phase comparison block having an arrangement as that of the corresponding block in FIGS. 2 and 3.

Figure 6:
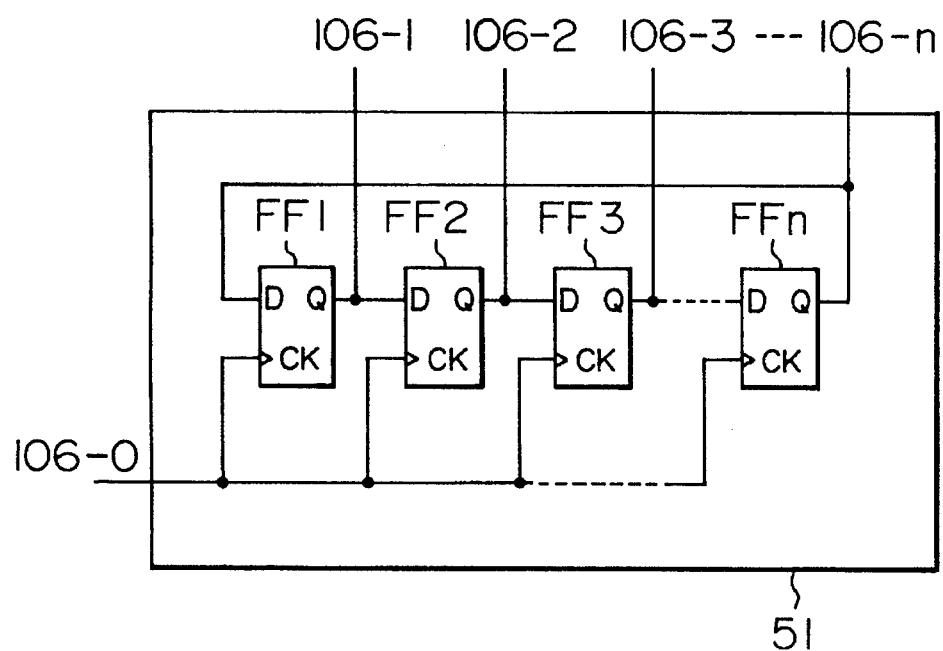
FIG. 6 is a block diagram of a specific example of a counter in FIG. 5.

The counter 51 may include such a ring counter which includes 'n' D type flip-flops FF1 to FFn having the output clocks $106_{-1}$ to $106_{-n}$ as shown in FIG. 6.

In this embodiment, the value of the phase number 'n' determined by the arrangement of the VCO 14a has no limitation. However, since the timing extraction circuit includes the counter 51 for 'n'-frequency division in the feedback loop, it becomes necessary that the oscillation frequency of the VCO 14a should be n (n: positive integer) times those of the prior art.

In the embodiment explained above, the initial phase difference at the time of starting the phase acquisition operation can be set to be between $-\pi/2$ and $\pi/2$ corresponding to half of that of the prior art. When an n-phase clock signal is employed, the initial phase difference can be set to be between $-\pi/n$ and $\pi/n$. Accordingly, the phase acquisition time can be shortened. Further, it becomes possible to make low the natural angular frequency $\omega_n$ necessary for completing the acquisition operation within a predetermine time $T_{sync}$.

Figure 7:
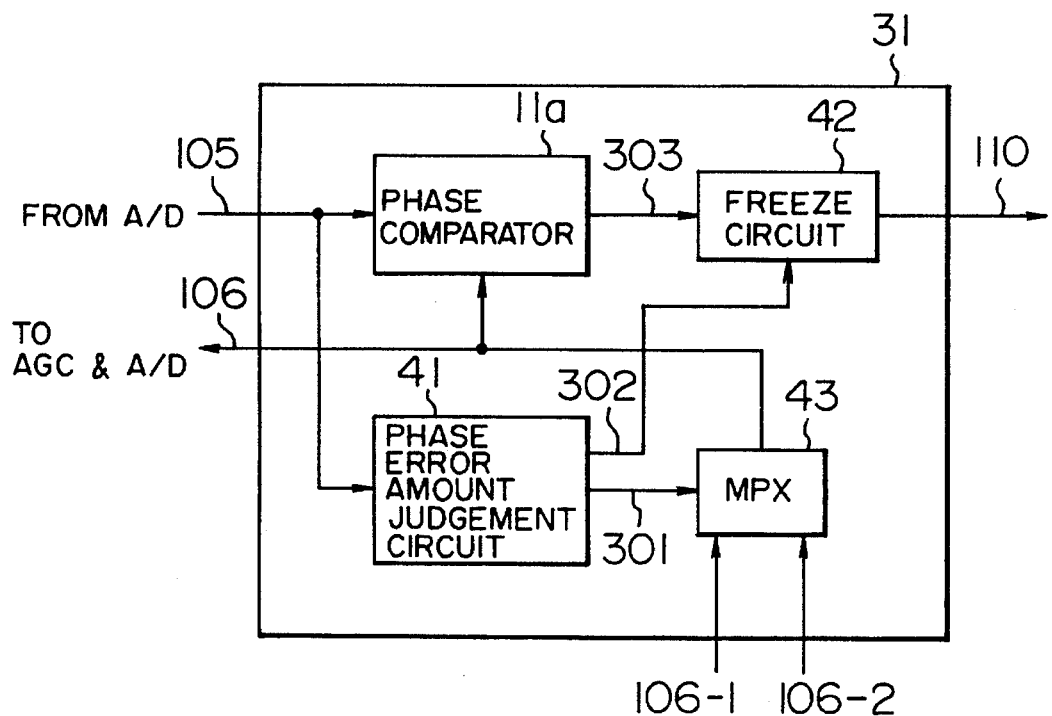
FIG. 7 is a block diagram of a further example of the phase comparison block in FIGS. 1 and 5.

FIG. 7 shows a block diagram of a further specific example of the phase comparison block 31 in FIGS. 1 and 5, in which reference symbol 11a denotes a phase comparator, parts corresponding to those in FIGS. 2 and 3 are denoted by the same reference numerals and symbols, and explanation thereof is omitted.

Figure 8:
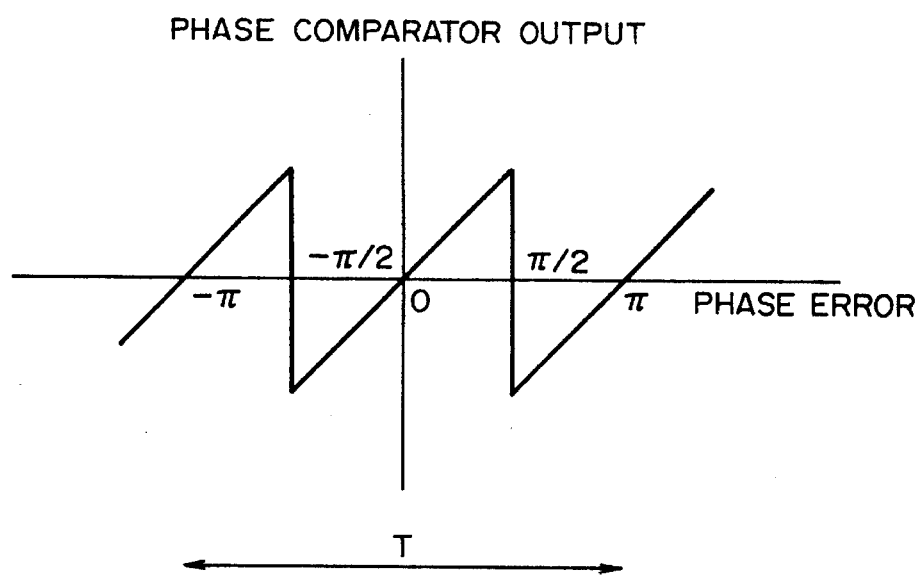
FIG. 8 is an input/output characteristic diagram of a phase comparator in FIG. 7.
Figure 9:
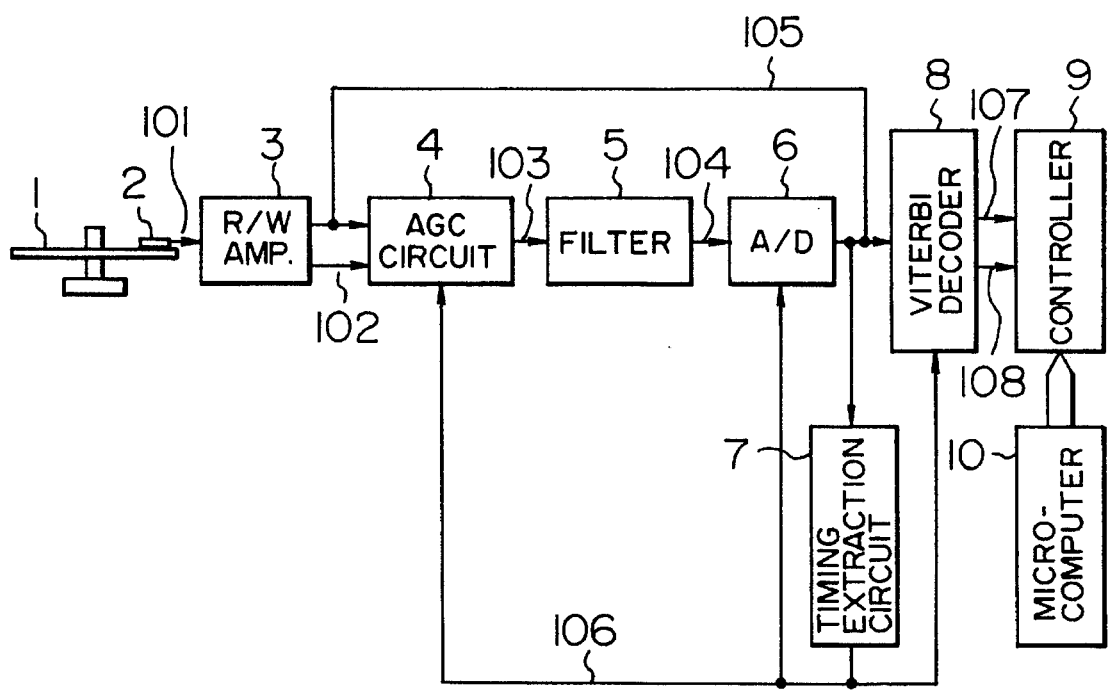
FIG. 9 is a block diagram of an example of a reproduction-associated signals processing circuit in a magnetic recording/reproducing apparatus.
Figure 10:
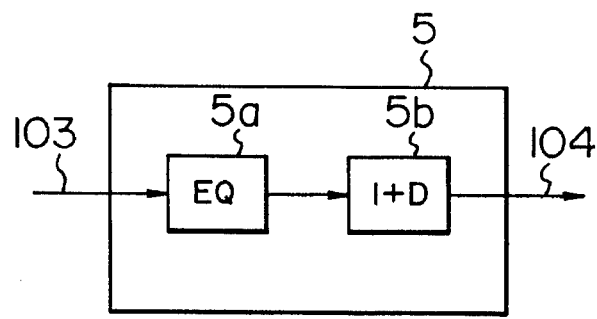
FIG. 10 is a block diagram of an example of a filter circuit in FIG. 9.

In the example of FIG. 7, a VCO (not shown) functions to output a 2-phase clock signal of clocks $106_{-1}$ and $106_{-2}$ having mutually opposite phases to an MPX 43. In the illustrated example, the phase comparator 11a does not have a saw tooth wave-like comparison output characteristic having inflection points appearing at intervals of $2\pi$ as shown in FIG. 4, but a saw tooth wave-like comparison output characteristic having polarity inverting points appearing at intervals of $\pi$ as shown in FIG. 8. For example, in such a conventional phase comparator 11 as shown in FIG. 12, when the output signal of the discriminator 21 is generated under the following conditions, a characteristic as shown in FIG. 8 can be obtained.

$$V_{201} = \sqrt{2} \ldots \sqrt{2} \sin(3\pi/8) \leq V_{105} \quad (15)$$
$$= 1 \ldots \sqrt{2} \sin(\pi/8) \leq V_{105} < \sqrt{2} \sin(3\pi/8)$$
$$= 0 \ldots -\sqrt{2} \sin(\pi/8) < V_{105} < \sqrt{2} \sin(\pi/8)$$
$$= -1 \ldots -\sqrt{2} \sin(3\pi/8) < V_{105} \leq -\sqrt{2} \sin(\pi/8)$$
$$= -\sqrt{2} \ldots V_{105} \leq -\sqrt{2} \sin(3\pi/8)$$

where $V_{201}$ denotes the output signal 201 of the discriminator 21.

In the PLL circuit using the phase comparator having such a comparison characteristic, the phase error between the input data signal and clock signal when the phase acquisition operation is completed and stabilized does not necessarily become zero and may be between $\pi$ and $-\pi$ depending on the initial phase. That is, there may exist a plurality of stable points of $-\pi$, 0 and $+\pi$ in the phase synchronization feedback loop.

Next, explanation will be made as to the operation of the phase comparison block 31 in FIG. 7.

When a command indicative of a phase acquisition start is issued from a controller (not shown), a phase error amount judgement circuit 41 outputs a control signal 301 in such a manner that the MPX 43 selects reference one $106_{-1}$ of clocks $106_{-1}$ and $106_{-2}$ received from a VCO (not shown). At the same time, the phase error amount judgement circuit 41 outputs a control signal 302 in such a manner that a freeze circuit 42 passes an output data signal 303 received from the phase comparator 11a as it is without processing it during a time Ts after the phase acquisition start of the freeze circuit.

The phase comparator 11a detects a phase error amount from a data signal 105 sampled by the A-to-D converter 6 (see FIGS. 1 and 5) on the basis of the clock $106_{-1}$ issued from the MPX 43, and supplies to the D-to-A converter 12 (see FIGS. 1 and 5) via the freeze circuit 42. In this way, a feedback loop is established in the timing extraction circuit 31 to perform the phase acquisition operation.

At a time point when the time Ts elapsed, the output data signal 303 of the phase compartor 11a has a value of 0 and thus the feedback loop is stable. However, the phase difference between the input data signal 105 and the clock $106_{-1}$ selected by the MPX 43 is 0 or $\pm\pi$. The phase error amount judgement circuit 41 judges whether the phase difference is 0 or $\pm\pi$. Since the input value of the phase error amount judgement circuit 41 can take only 0 or $\pm\pi$, the judgement conditions can be determined, e.g., as follows.

$$V_{det} = 0 \ldots |V_{105}| \leq \sqrt{2}/2 \quad (16)$$
$$= 1 \ldots \text{else}$$

In this case, a threshold margin is as large as $\sqrt{2}/2$, so that there is a low erroneous judgement possibility even when the judgement is carried out based on only one sample.

When the judgement result $V_{det}$ of the phase error amount judgement circuit 41 is zero, that is, when the phase difference or error between the input data signal 105 and the clock signal from the MPX 43 is zero, the phase error amount judgement circuit 41 does not change the control signals 301 and 302 to be sent to the MPX 43 and freeze circuit 42 and continues its feedback operation as it is.

When the judgement result of the phase error amount judgement circuit 41 is 1, that is, when the phase error between the input data signal 105 and the clock signal from the MPX 43 is $-\pi/2$ or $\pi/2$, the phase error amount judgement circuit 41 outputs the control signal 301 in such a manner that the MPX 43 changes the clock so far selected to the other anti-phase clock. This results in that the clock sent from the MPX 43 is shifted by a phase of $\pi/2$ so that the phase error between the input data signal 105 and the clock from the MPX 43 becomes zero. Since the phase comparator 11a calculates the phase error with use of the input values of consecutive 2 samples, the phase comparator 11a outputs a value not necessary for the feedback control at the time of the above clock phase shift. At this time, a temporary freeze command is given as the control signal 302 to the freeze circuit 42 so that the freeze circuit 42 masks the output data signal 303 of the phase comparator 11a caused by the $\pi/2$ phase shift. As has been explained in the foregoing, in accordance with this embodiment, when the period of the saw tooth wave is set to be $\pi$ in the comparison characteristic of the phase comparator compared to $2\pi$ in the prior art, the initial phase difference at the time of the phase acquisition start can be set to be half of an ordinary value as $-90/2$ or $\pi/2$, which results in that the natural angular frequency $\omega_n$ necessary for completing the acquisition operation within the predetermined time $T_{sync}$ to be made small.

Although the above explanation has been made in connection with the case of the 2-phase clock signal, the present invention is not limited to the specific example but the number of phases in the clock signal may also be increased on such principle as mentioned above.

As has been explained above, in accordance with the present invention, the phase acquisition time can be shortened. Further, the value of $\omega_n$ necessary for realizing the same acquisition time as the ordinary one can be suppressed low. Accordingly, the phase margin of the phase synchronization loop can be secured with highly reliable operation.

It will be appreciated that the present invention is not restricted to the foregoing embodiments and includes all modifications falling within the scope or subject matter of the accompanying claims. For example, though the above explanation has been made in connection with the case of the magnetic recording/reproducing apparatus in the foregoing embodiments, it goes without saying that the present invention may be applied also to another recording/reproducing apparatus designed for an optical disk unit, a magneto-optical disc unit or other type of recording medium.

What is claimed is:

1. A clock timing extraction circuit for generating a clock signal synchronized with a reproduced signal in an apparatus for recording/reproducing data in/form an information recording medium, comprising:

a phase comparator for comparing said reproduced signal with a selected clock signal to generate a phase error signal;

a clock signal generation circuit, having an output signal whose frequency is adjusted in order to cause said phase error signal to approach zero, and outputting a plurality of clock signals having mutually different phase differences;

a selection circuit for outputting one of said plurality of clock signals as the selected clock signal on the basis of a selection signal;

a phase difference judgment circuit for receiving said reproduced signal and for determining one of said plurality of clock signals having a minimum phase error and generating the selection signal for selection of the selected clock signal; and a freeze circuit for blocking an output of said phase comparator until said selected clock signal having the minimum phase error is selected.

2. A clock timing extraction circuit as set for in claim 1, wherein said phase difference judgement circuit generates a first selection signal to select a first clock signal from said plurality of clock signals, judges whether or not the phase error between said reproduced signal and said first clock signal issued from said selection circuit corresponds to a predetermined value, generates the selection signal to maintain said first clock signal when the phase error has the predetermined value and generates the selection signal to select the clock signal corresponding to the predetermined value of the phase error when the phase error does not have the predetermined value; and said freeze circuit blocks the output of said phase comparator until the clock signal corresponding to the predetermined value of the phase error is selected.

3. A clock timing extraction circuit as set forth in claim 2, wherein the plurality of clock signals output by said clock signal generation circuit are represented by 'n' clock signals having phase mutually shifted by 180 degrees ('n': positive integer), and said phase difference judgement circuit generates the selection signal to select one of said 'n' clock signals whose phase error with respect to said reproduced signal has a value included in a range of −180 degrees/n to +180 degrees/n.

4. A clock timing extracting circuit as set forth in claim 3, wherein said clock signal generation circuit generates two clock signals having phase mutually shifted by 180 degrees, and said phase difference judgement circuit generates the selection signal to select one of said 2 clock signals whose phase error with respect to said reproduced signal has a value included in a range of −90 degrees to +90 degrees.

5. A clock timing extraction circuit as set forth in claim 2, wherein said phase difference judgement circuit detects the phase error between said selected clock signal and said reproduced signal on said basis of the output of said phase comparator.

6. A clock timing extraction circuit as set forth in claim 5, wherein said phase comparator generates an output signal which linearly varies in response to variation of said phase error between −180 degrees and 180 degrees.

7. A clock timing extraction circuit as set forth in claim 2 wherein said clock signal generation circuit includes a clock generator for generating a single original clock signal and a converter for subjecting said original clock signal to a frequency dividing operation to generate 'n' clock signals having different frequencies and representing the plurality of clock signals output by the clock generation circuit.

8. A clock timing extraction circuit for generating a clock signal synchronized with a reproduced signal in an apparatus for recording/reproducing data in/form an information recording medium, comprising:

a phase synchronization feedback loop including a phase comparator for comparing said reproduced signal with a selected clock signal to generate a phase error signal and a clock signal generation circuit, having an output signal whose frequency is adjusted in order to cause said phase error signal to approach zero, and for outputting a plurality of clock signals having a phase difference therebetween, said phase comparator having an output characteristic with a plurality of phase error points of synchronization stable points present in one period;

a phase difference judgment circuit for receiving the reproduced signal and for detecting a phase error when a phase acquisition operation is completed in said feedback loop on the basis of any one of said plurality of clock signals to generate a selection signal according to said phase error detected by the phase difference judgment circuit; and a selection circuit for outputting one of said plurality of clock signals as the selected clock signal according to the selection signal.

9. A clock timing extraction circuit as set forth in claim 8, wherein said clock signal generation circuit generates two clock signals having phases mutually shifted by 180 degrees, and said phase comparator has synchronization stable points for generation of a zero error signal for phase errors of −180, 0 and +180 degrees and outputs the phase error signal which linearly varies in response to variation of said phase error in a zone except for said synchronization stable points.

10. A clock timing extraction circuit for generating a clock signal synchronized with a reproduced signal in an apparatus for recording/reproducing data in/from an information recording medium, comprising:

a phase comparator for comparing said reproduced signal with a selected clock signal to generate a phase error signal, said comparator having an output characteristic to output a zero phase error signal at a plurality of predetermined phase error points in a phase error range of −180 degrees to +180 degrees; a clock signal generation circuit, having an output signal whose frequency is adjusted in order to cause said phase error signal to approach zero, and for outputting a plurality of clock signals having a phase difference therebetween;

a phase difference judgment circuit for receiving the reproduced signal and for detecting a phase error when said phase error signal is zero and comparing the phase error detected by the phase difference judgment circuit with a predetermined value to generate a selection signal based on a comparison result; and a selection circuit for outputting one of said plurality of clock signals as the selected clock signal according to the selection signal.

11. An apparatus for recording/reproducing data in/from an information recording medium having an automatic gain control (AGC) circuit for limiting an amplitude of a reproduced signal from said recording medium, a clock timing extraction circuit for extracting a clock signal from an output signal of said AGC circuit, and a decoder for decoding the output signal of said AGC circuit on the basis of the clock signal extracted by said clock timing extraction circuit, said clock timing extraction circuit comprising:

a phase comparator for comparing said reproduced signal with a selected clock signal to generate a phase error signal;

a clock signal generation circuit, having an output signal whose frequency is adjusted in order to cause said phase error signal to approach zero, and for outputting a plurality of clock signals having phases mutually shifted;

a selection circuit for outputting one of said plurality of clock signals according to a selection signal;

a phase difference judgment circuit for receiving the reproduced signal and for determining which one of said plurality of clock signals has a phase error with respect to said reproduced signal that is a minimum and for generating the selection signal to select said determined one of said plurality of clock signals; and a freeze circuit for blocking an output of said phase comparator until said determined one of said plurality of clock signals as the selected clock signal having a minimum phase error is selected.

12. An apparatus for recording/reproducing data in/from an information recording medium having an automatic gain control (AGC) circuit for limiting an amplitude of a reproduced signal from said recording medium, a clock timing extraction circuit for extracting a clock signal from an output signal of said AGC circuit, and a decoder for decoding the output signal of said AGC circuit on the basis of the clock signal extracted by said clock timing extraction circuit, said clock timing extraction circuit comprising:

a phase synchronization feedback loop including a phase comparator for comparing said reproduced signal with a selected clock signal to generate a phase error signal and a clock signal generation circuit, having an output signal whose frequency is adjusted in order to cause said phase error signal to approach zero, and for outputting a plurality of clock signals having a phase difference therebetween, said phase comparator having an output characteristic with a plurality of phase error points of synchronization stable points present in one period;

a phase difference judgment circuit for receiving the reproduced signal and for detecting a phase error when a phase acquisition operation is completed in said feedback loop on the basis of any one of said plurality of clock signals to generate a selection signal according to said detected phase error; and a selection circuit for outputting one of said plurality of clock signals as the selected clock signal according to the selection signal.

* * * * *